United States Patent [19]

Tsujimoto

[11] Patent Number: 4,802,134
[45] Date of Patent: Jan. 31, 1989

[54] SEMICONDUCTOR MEMORY DEVICE HAVING SERIAL ADDRESSING SCHEME

[75] Inventor: Akira Tsujimoto, Tokyo, Japan

[73] Assignee: NEC Corporation, Tokyo, Japan

[21] Appl. No.: 944,115

[22] Filed: Dec. 22, 1986

[30] Foreign Application Priority Data

Dec. 20, 1985 [JP] Japan .................. 60-288729

[51] Int. Cl.$^4$ .............. G11C 7/00; G11C 8/00; G11C 11/40
[52] U.S. Cl. .................. 365/230; 365/239; 365/240
[58] Field of Search ............ 365/230, 239, 240, 241

[56] References Cited
U.S. PATENT DOCUMENTS

| | | | |
|---|---|---|---|
| 4,330,852 | 5/1982 | Redwine et al. | 365/240 X |
| 4,429,375 | 1/1984 | Kobayashi et al. | 365/240 |
| 4,611,299 | 9/1986 | Hori et al. | 365/230 X |
| 4,633,441 | 12/1986 | Ishimoto | 365/230 X |
| 4,667,313 | 5/1987 | Pinkham et al. | 365/240 |
| 4,688,197 | 8/1987 | Novak et al. | 365/230 |

*Primary Examiner*—Stuart N. Hecker
*Assistant Examiner*—Alyssa H. Bowler
*Attorney, Agent, or Firm*—Sughrue, Mion, Zinn, Macpeak & Seas

[57] ABSTRACT

A semiconductor memory of the type that a plurality of memory locations are sequentially addressed in synchronism with a chain of clock pulses without externally applied address signals is disclosed. The memory is provided with a detection circuit for detecting a selection of a predetermined memory location and thus it is allowed for user to know which memory location has been addressed.

7 Claims, 7 Drawing Sheets

FIG 7

SEMICONDUCTOR MEMORY DEVICE HAVING SERIAL ADDRESSING SCHEME

BACKGROUND OF THE INVENTION

The present invention relates to a semiconductor memory formed on a semiconductor substrate, and more particularly to a semiconductor memory IC having a serially addressing scheme for serially reading a plurality of bit locations without address information from the outside.

Many kinds of memories have been developed and used widely in accordance with purposes and applications. Of those, a memory having a large capacity is used in a system handling large amount of data such as those for voices or images. The memory of this kind is not required to operate at a very high speed, but to be easy to use at low cost. Therefore, a memory of serially addressing type has been proposed, and devices have been made to minimize the number of external pins so as to reduce the cost. As one of approaches to achieve the above, a reduction in the number of address terminals has been proposed and practised. Since such a memory having a large memory capacity has a wide address space which requires a large address bit length. This makes it necessary to use a great number of address terminals if the conventional address access system is adopted. For example, eighteen address terminals are required in case a memory composed of 320 word lines in rows and 700 bit lines (or bit line pairs) in columns to have a capacity of 224 kbits is to be produced. On the other hand, it is a current practice to access the voice or image data not at random but sequentially in a fixed order of columns so that the column addresses are repeatedly renewed. As a result, the column address terminals can be dispensed with if a counter or a shift register is provided inside of a memory and is incremented or decremented to generate a column address. Thus, a plurality bits of data read on bit lines in columns are sequentially addressed one by one by incrementing or decrementing contents of the counter or shift register.

Since the memory of this kind need not receive any column address from the outside, it is advantageous in that it can be fabricated at a low cost and used easily. However, the memory is disadvantageous in that which column is being accessed, i.e., which bit line the data being read or written cannot be known from the outside of the memory. In the memory of this kind, generally speaking, after all the data set in an output data register have been read out, the data held in this register have to be written again in the original locations. This operation is generally performed independently of a refreshing operation although it can be conducted together with the latter operation. Moreover, the writing operation is required for maintaining the memory data. Since, however, the user of this memory cannot know from the outside when the read of the data (of 700 bits, for example) of one word is to from the outside to a row decoder for performing a word selecting signal is counted by a counter, which is prepared outside of the memory, to locate the position of the bit being accessed, by which the aforementioned rewrite timing is checked. This raises a serious defect that the number of parts to be added to the outside of the memory is increased to complicate the system design and to necessarily raise the cost. Even if the check is conducted outside, moreover, the timing detected at the outside and the actual timing in the memory are not necessarily coincident, and there is possibility of a discrepancy in the timing due to characteristic dispersions depending upon the different lengths of the signal lines and the fabricating conditions of the memory. This problem is predicted to become the more prominent especially as the number of cells per one word line (or one bit line) becomes the greater.

SUMMARY OF THE INVENTION

An object of the present invention is to provide a semiconductor memory which can grasp an internal addressing operation timing reliably and easily.

The memory according to the present invention is of the type having a memory array of memory cells arranged in rows and columns, a row selection circuit for selecting one of the rows of the memory array, a serial selection circuit for selecting columns of the array one by one in synchronism with a chain of clock pulses, and an output circuit for outputting data on the selected column, and is featured by an address detection circuit coupled to a predetermined column for generating a detection signal when the above predetermined column is accessed.

According to the present invention, it is possible to internally detect the internal address or operation timing of a predetermined bit being accessed inside of the memory so that the timing conforming to a real operation sequence can be recognized reliably and easily outside of the memory without requiring any complicated additional circuits.

According to the present invention, more specifically, an address prepared inside of the memory can be known easily and precisely without feeding any address to the memory from the outside thereby to remarkably facilitate the controllability of not only the aforementioned rewrite but also the other memory control requiring the bit access timing.

DETAILED DESCRIPTION OF THE INVENTION

Figure 1:
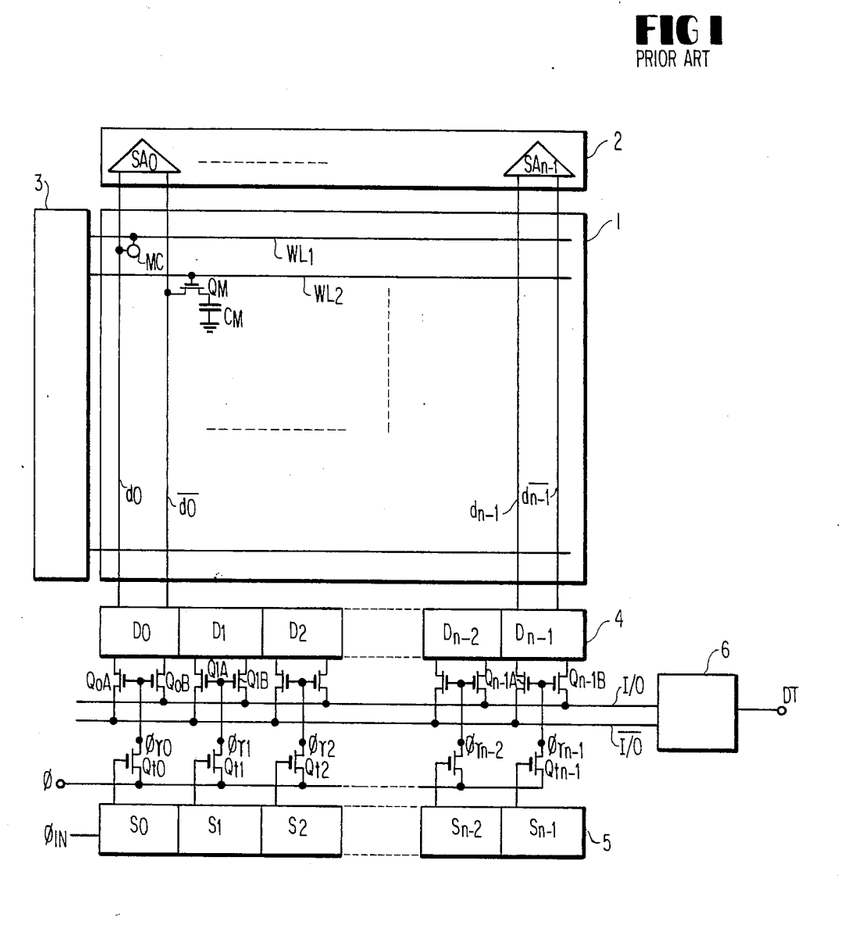
FIG. 1 is a schematic block diagram showing a memory according to a prior art.

The serially addressing type memory device according to a prior art is shown in FIG. 1.

A memory cell array 1 includes a plurality of memory cells MC each composed of a memory cell transistor $Q_M$ and a storage capacitor $C_M$. "m" word lines $WL_1$ to $WL_n$ are arranged in rows and "n" pairs of bit lines $d_0$, $\overline{d_0}$ to $d_{n-1}$, $\overline{d_{n-1}}$ are arranged in columns in the array 1. A plurality of sense amplifiers SA to $SA_{n-1}$ coupled to the pairs of bit lines. A row decoder 3 selects one of the word lines based on row address information.

A data register section 4 is composed of "n"data holding circuits $D_0$ to $D_{n-1}$ having input ends coupled to "n"pairs of bit lines $d_0$, $\overline{d_0}$ to $d_{n-1}$, $\overline{d_{n-1}}$, respectively. Each data holding circuit e.g. $D_0$ operatively holds data on the pair of bit lines $d_0$, $\overline{d_0}$. A pair of output ends of each data holding circuit are coupled to a pair of bus lines I/O and $\overline{I/O}$ through each pair of transfer gates $Q_{0A}$, $Q_{0B}$ to $Q_{n-1A}$, $Q_{n-1B}$.

The pair of bus lines I/O and $\overline{I/O}$ are connected to a pair of input ends of an input/output circuit 6. A shift register 5 has "n"shift stages $S_0$ to $S_{n-1}$ and shifts a single selection signal towards rightward one by one in synchronism with a chain of clock pulses $\phi_{IN}$. Driver transistors $Q_{t0}$ to $Q_{tn-1}$ generates selection signals $\phi_{T0}$ to $\phi_{Tn-1}$ for conducting the pairs of transfer gates $Q_{0A}$, $Q_{0B}$ to $Q_{n-1A}$, $Q_{n-1B}$ upon coincidence of a drive pulse $\phi$ and the outputs of the shift register 5, respectively. The row decoder 3 selects one of the word lines, data are read out in parallel from the n-bit cells connected with the respective word lines and are set in the register 4. The data thus set in the register 4 are read out one bit by one bit to an data input/output terminal DT through the pair of bus lines I/O, $\overline{I/O}$ and the circuit 6 in response to the shift clock $\phi_{CL}$. Incidentally, the n-bit data inputted in series from the terminal DT circuit 6 are once set in the register 4 and are then written in parallel in the n cells connected with the word lines selected. Operations are shown in the time chart of FIG. 2.

Figure 2:
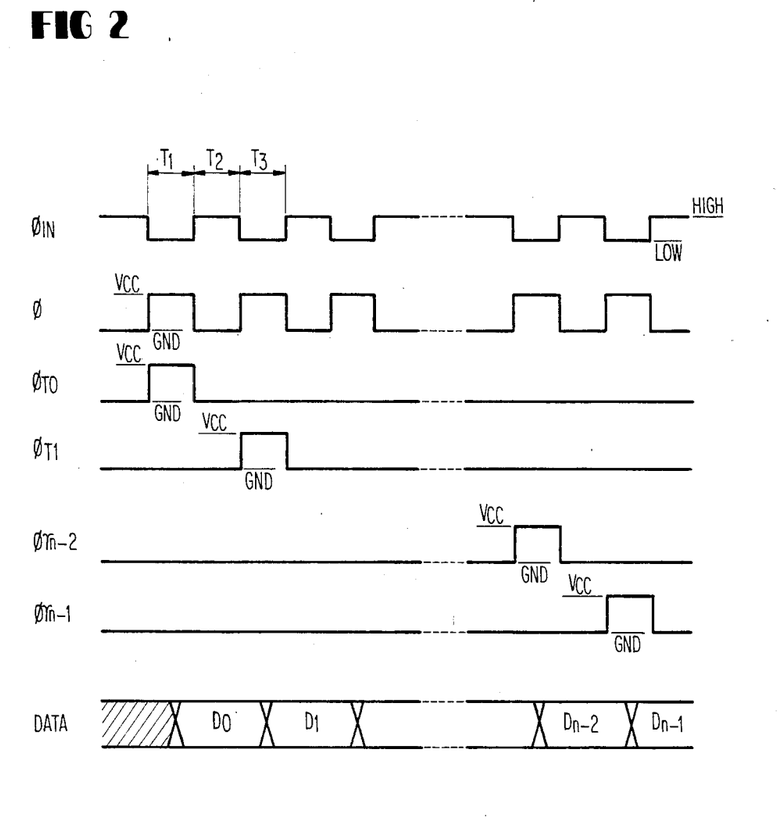
FIG. 2 is a timing diagram showing operations of the memory of FIG. 1.

The shift register 5 holds its state in response to a low level of $\phi_{IN}$ and shifts the contents of the respective stages by one rightwardly in response to a high level of $\phi_{IN}$. The pulse $\phi$ assumes a high level during a period that $\phi_{IN}$ is at low and a low level at least during a period that $\phi_{IN}$ is at high.

First, during a period $T_1$, the stage $S_0$ generates "1"output while other stages $S_1$ to $S_{n-1}$ generate "0"output. Therefore, a signal $\phi_{T0}$ is generated in response to a high level of $\phi$. Accordingly, the transfer gate pair $Q_{0A}$ and $Q_{0B}$ are rendered conductive so that data stored in the holding circuit $D_0$ is outputted to the terminal DT via a pair of bus lines I/O, $\overline{I/O}$ and the circuit 6.

Then, during a period $T_2$, "1"output is shifted from $S_0$ to $S_1$ in the shift register 5 in response to a high level of $\phi_{IN}$. Subsequently, during a period $T_3$, a selection signal $\phi_{T1}$ is generated in response to a high level of $\phi$ so that data stored in $D_1$ is read out at the terminal DT via $Q_{1A}$, $B_{1B}$.

In this manner, data stored in $D_0$ to $D_{n-1}$ in the data register 4 are sequentially outputted one by one in synchronism with repetition of pulses of $\phi_{IN}$ and $\phi$.

This memory is advantageous in that a plurality bits of memory location are accessed sequentially without any specific column address information.

Figure 3:
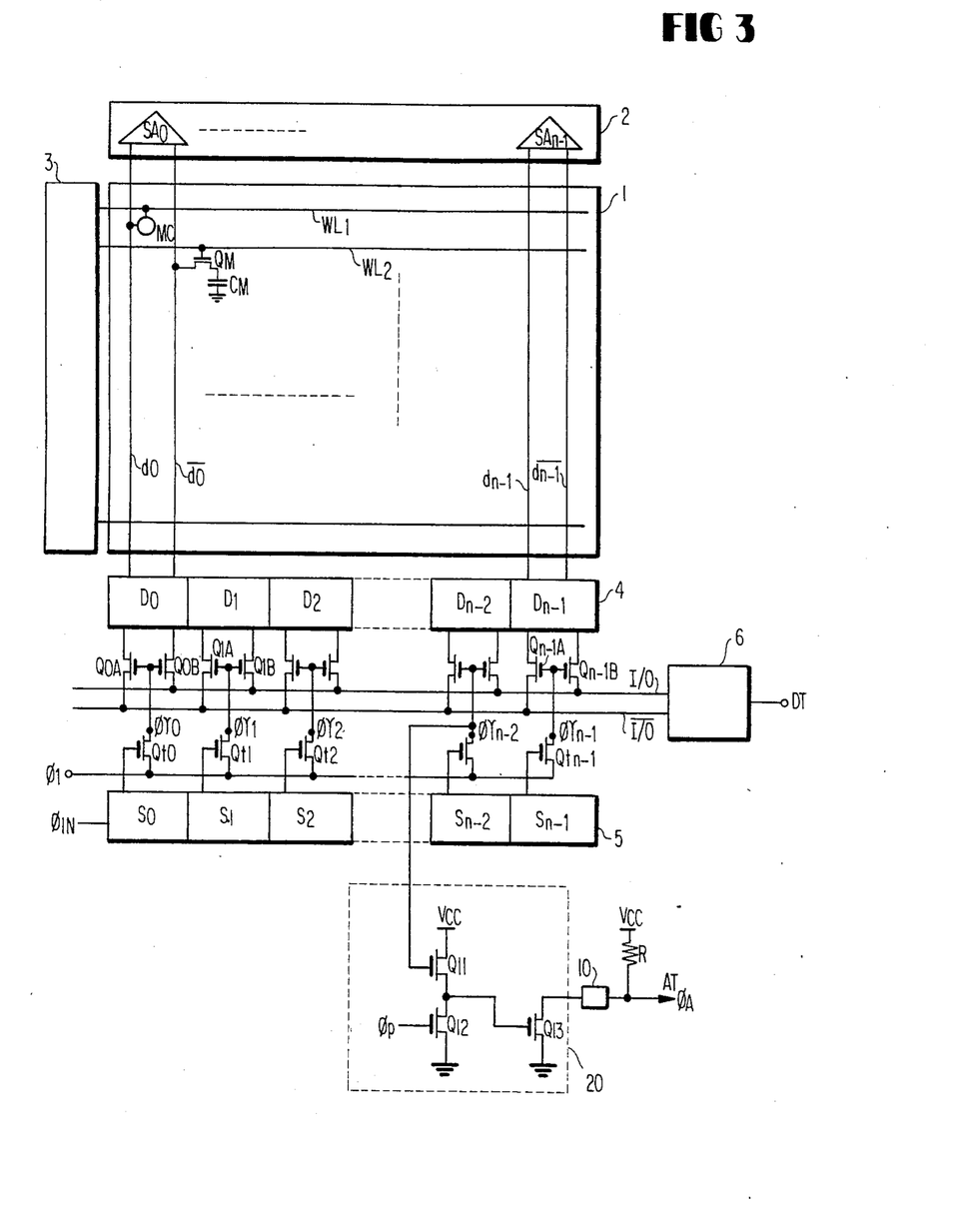
FIG. 3 is a schematic block diagram of a memory according to a first embodiment of the present invention.

However, on the other hand, although it is difficult to know which column is accessed from the outside. FIG. 3 shows a first embodiment of the invention. In FIG. 3, the portions corresponding to those in FIG. 1 are denoted by the similar references.

This embodiment comprises a timing detection circuit 20 added to the prior art circuit of FIG. 1. The timing detection circuit 20 has an input end receiving one of the selection signals $\phi_{T0}$ to $\phi_{Tn-1}$ and an output end coupled to an external terminal 10 of the memory IC, that is a pad on the semiconductor substrate of the memory IC. In this embodiment, the input end of the circuit 20 is connected to $\phi_{Tn-2}$. The circuit 20 is composed of a series circuit of field effect transistors (FETs) $Q_{11}$ and $Q_{12}$ coupled between $V_{cc}$ and ground serving as a buffer and a series circuit of a load resistor R and an FET $Q_{13}$ coupled between ground and a detection terminal AT. A gate of FET $Q_{11}$ is connected to the next-to-last selection signal $\phi_{Tn-2}$ and a reset signal $\phi_P$ is applied to a gate of FET $Q_{12}$.

An outside system (not shown) utilizing the memory output data through the output terminal DT or a test system testing the memory IC has a terminal AT which is connected to the terminal 10 of the memory IC of the embodiment, and a pull-up resistor R is connected between the terminal AT and a power supply $V_{cc}$ which should be common to that $V_{cc}$ for the memory IC. The terminal 10, or the terminal AT, is used to detect that the holding circuit $D_{n-2}$ is being selected to output the data stored therein. In case when the terminal 10 is used by a testing apparatus, the resistor R is removed from the terminal 10 after testing to reduce a power consumption when the memory IC is used in a system where the detection is not required.

It is also possible to fabricate the resistor R on the same semiconductor chip of the memory.

the reset signal $\phi_P$ assume a high level before readout data in the respective columns are stored in the data register 4, and a low level during a serial accessing period during which the memory is accessed.

The detection circuit 20 generates a "1"level output ($\phi_A$) before the signal $\phi_{Tn-2}$ is energized to a "1"level and a "0"level output ($\phi_A$) when the signal $\phi_{Tn-2}$ is energized to a "1"level and thereafter in the same serial addressing cycle. Thus, by monitoring a level of the terminal 10, it can be known that the serial column access has reached the predetermined column (in this case the next-to-last column "n−2").

Figure 4:
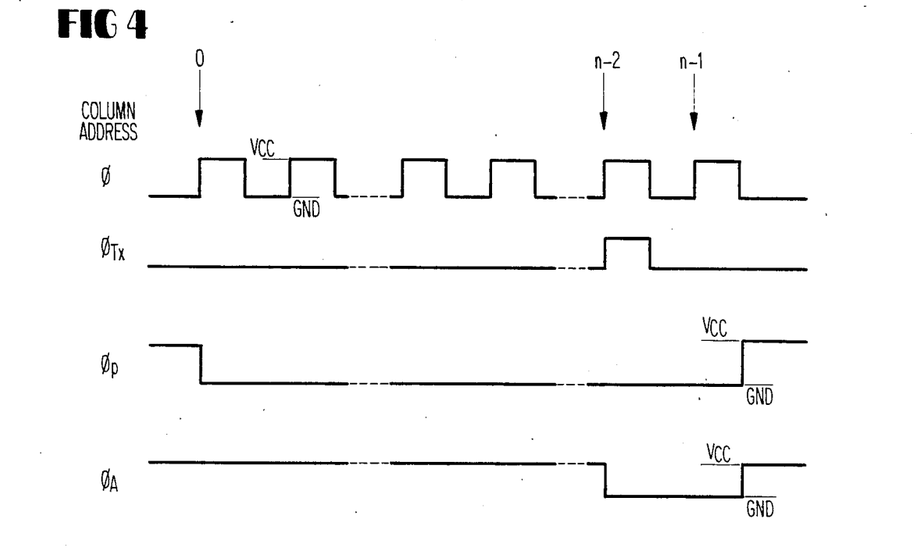
FIG. 4 is a timing diagram showing operations of the memory of FIG. 3.

The above operation is illustrated in FIG. 4.

In this embodiment, "n−2"th column is subject to detection of access thereto. However, in place of "n−2"th column, any one (xth) of columns "0"th to "n−1"th can be similarly subjected to the detection of access thereto by connecting the gate of FET $Q_{11}$ to a desired x-th selection signal $\phi_{Tx}$ (x being one of 0 to n−1).

Figure 5:
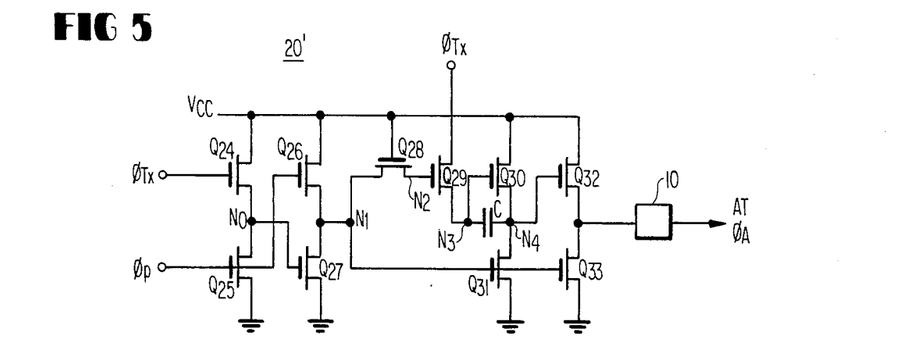
FIG. 5 is a schematic circuit diagram showing a major part of the memory according to a second embodiment of the present invention.
Figure 6:
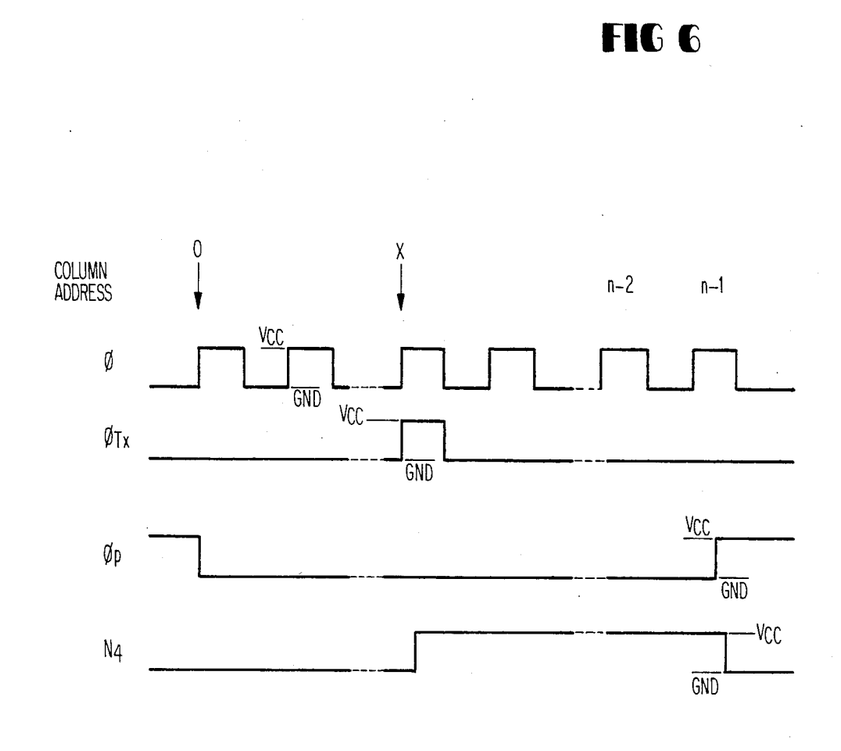
FIG. 6 is a timing diagram showing operation of the second embodiment.

FIG. 5 shows another embodiment of the detecting circuit of the present invention. A buffer circuit composed of MOST's $Q_{24}$ to $Q_{33}$ has a function to latch the selection signal $\phi_{Tx}$. Since the buffer circuit generates both of $V_{cc}$ and ground level to the pad 10, no pull-up resistor is required. FIG. 6 is a time chart for explaining the detecting circuit of FIG. 5. The voltage at an output node $N_4$ rises as a result of the transition of the signal $\phi_{Tx}$ of x-th column (x being one of 0 to n−1) to the high level and maintains this high level till the rising point of the signal $\phi_p$. As a result, effects similar to those of FIG. 3 can be attained.

Figure 7:
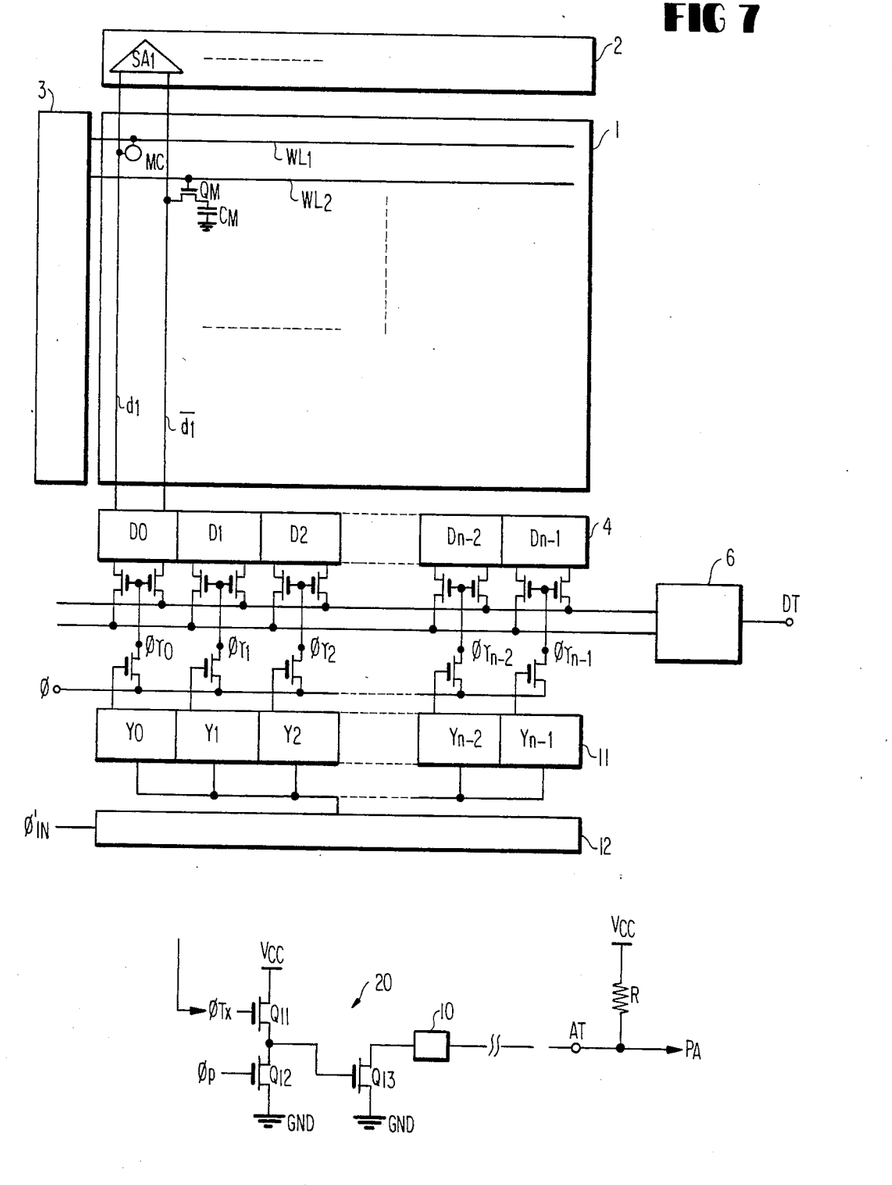
FIG. 7 is a schematic block diagram of a third embodiment of the present invention.

FIG. 7 shows a memory according to a third embodiment of the invention.

This embodiment is featured in that a column address counter 12 which is incremented in response to a clock signal $\phi'_{IN}$ and a column decoder 11 for generating column selection signals $\phi_{T0}$ to $\phi_{Tn-1}$ by decoding contents of the coutner 12, in place of shift register 5 of FIG. 3. The remaining operations are similar to those of the aforementioned serial access memory such that the individual states of the data register are sequentially selected in response to the selection signal $\phi_{TX}$ (wherein X=0 to n−1) from the column decoder to conduct the reading and writing operations through the data terminal DT.

As has been described hereinbefore, according to the present invention, the address information at a predetermined read and write addresses can be obtained without counting the memory control signals at the outside so that the system using the serial access memory can be remarkably simplified.

Moreover, an arbitrary selection signal may be fed to the detection circuit or the individual detected signals can be combined to know an arbitrary address by connecting a plurality of detecting circuits in parallel.

I claim:

1. A semiconductor memory device comprising a memory array of memory cells arranged in rows and columns, row selecting means for selecting one of said rows, column selecting means for serially selecting said columns consecutively in synchronism with clock signals, output means for outputting data on the selected column, an external terminal, a column address detecting means for generating a detection signal when a predetermined one of said columns is selected by said column selecting means, and means for applying said detection signal to said external terminal, whereby the presence of said detection signal at said external terminal indicates that said predetermined column is selected by said column selecting means.

2. the memory according to claim 1, in which word lines are provided in said rows and a plurality pairs of bit lines are provided in said columns, in said memory array.

3. A memory according to claim 1, further comprises a plurality of data holding circuits each provided for each of said columns and operatively holding data read from a selected memory cell of its own column.

4. The memory according to claim 1, further comprises a bus line coupled to the input of said output means.

5. The memory according to claim 2, in which said column selecting means includes a plurality of transfer gates each coupled between each bit line and the input of said output means, a shift register having a plurality of stages, and drive means responsive to the output of said register means for enabling one of said transfer gates.

6. A semiconductor memory device comprising a plurality of memory locations, first means for generating address information in response to pulses, second means responsive to said address information generated by said first means for addressing one of said memory locations, third means coupled to said second means for generating a detection signal when a predetermined one of said memory location is addressed by said second means, an external terminal, and means for applying said detection signal to said external terminal.

7. A semiconductor memory device comprising a plurality of word lines, a plurality of bit lines, a plurality of memory cells each coupled to one of said word lines and one of said bit lines, a row selection circuit for selecting one of said word lines, a plurality of data holding circuits each coupled to each one of said bit lines for operatively holding data on the associated bit line, a bus line, a plurality of transfer gates each coupled between each one of said data holding circuits and said bus line, an output circuit coupled to said bus line for operatively generating data on said bus line, a serial selecting circuit having a plurality of outputs each coupled to each one of said transfer gates for enabling said transfer gates sequentially, a selection detecting circuit coupled to a predetermined one of said outputs of said serial selecting circuit for generating a detection signal when said predetermined one of said outputs of said serial selecting circuit is enabled, an external terminal, and means for applying said detection signal to said external terminal.

* * * * *

UNITED STATES PATENT AND TRADEMARK OFFICE
CERTIFICATE OF CORRECTION

PATENT NO. : 4,802,134

DATED : January 31, 1989

INVENTOR(S) : AKIRA TSUJIMOTO

It is certified that error appears in the above-identified patent and that said Letters Patent is hereby corrected as shown below:

Column 1, line 23, delete "practised" and insert --practiced--.

Signed and Sealed this

Fifth Day of September, 1989

Attest:

DONALD J. QUIGG

Attesting Officer

Commissioner of Patents and Trademarks